United States Patent [19]

Mohri et al.

[11] Patent Number: 4,591,788
[45] Date of Patent: May 27, 1986

[54] MAGNETIC FIELD SENSING DEVICE

[75] Inventors: Kaneo Mohri, Fukuoka; Toshinobu Kageyama, Aichi, both of Japan

[73] Assignee: Aisin Seiki Kabushiki Kaisha, Japan

[21] Appl. No.: 415,298

[22] Filed: Sep. 7, 1982

[30] Foreign Application Priority Data

Sep. 9, 1981 [JP] Japan ................... 56-141853

[51] Int. Cl.$^4$ ............... G01R 33/00; G01P 3/66; H01F 1/02
[52] U.S. Cl. .................. 324/260; 73/862.36; 73/862.69; 72/211; 148/105; 148/120; 148/31.55; 324/207; 324/244; 324/253; 324/262; 324/179; 340/870.31
[58] Field of Search .............. 324/179, 253, 260, 262, 324/228, 207, 208, 261; 72/311; 148/31.55, 121, 120, 123, 105; 365/133, 136, 137; 73/862.36, 862.69, DIG. 2; 340/941, 870.31

[56] References Cited

U.S. PATENT DOCUMENTS

| | | | |
|---|---|---|---|
| 3,092,813 | 6/1983 | Broadbent | 365/133 X |
| 3,264,416 | 8/1966 | Jorden et al. | 324/208 X |
| 3,445,928 | 5/1969 | Beynon | 324/254 X |
| 3,699,550 | 10/1972 | Spain | 365/136 |
| 3,820,090 | 6/1974 | Wiegand | 365/133 |
| 3,892,118 | 7/1975 | Wiegand | 365/133 X |
| 3,959,751 | 5/1976 | Garshelis | 335/3 |
| 3,961,297 | 6/1976 | Garshelis | 335/3 |
| 4,150,214 | 4/1979 | Zabler | |
| 4,236,093 | 11/1980 | Birnbaum | 324/207 X |
| 4,414,855 | 11/1983 | Iwasaki | 73/862.36 |
| 4,434,411 | 2/1984 | Anderson et al. | 335/208 |
| 4,449,115 | 5/1984 | Koerner | 340/941 |

FOREIGN PATENT DOCUMENTS 2806249 8/1979 Fed. Rep. of Germany.
3014783 12/1981 Fed. Rep. of Germany.
2076596 12/1981 United Kingdom.

OTHER PUBLICATIONS

Judge et al., "Magnetic Memory Device Utilizing Coupled Film", IBM/TDB, vol. 10, No. 2, Jul. 1967, pp. 144–145.

Primary Examiner—Gerard R. Strecker
Assistant Examiner—Warren S. Edmonds
Attorney, Agent, or Firm—Sughrue, Mion, Zinn, Macpeak and Seas

[57] ABSTRACT

A magnetic field sensing device for sensing low levels of magnetic intensity is composed of a ribbon-shaped strip of amorphous magnetic material having at least one twist along the length thereof between the ends of the strip. Subsequent to imparting the desired number of twists to the strip, the strip is supported in the twisted condition. The device is capable of generating a pulse in response to the presence of an external magnetic field similar to the Wiegand wire effect.

5 Claims, 7 Drawing Figures

MAGNETIC FIELD SENSING DEVICE

BACKGROUND OF THE INVENTION

The present invention is directed to a magnetic field sensing device and more specifically to a twisted, ribbon-shaped strip of amorphous magnetic material which is supported in the twisted condition and exhibits an effect similar to a Wiegand effect.

A Wiegand wire is a bistable magnetic device having specific characteristics obtainable by processing a thin ferromagnetic wire to form a central relatively "soft" core portion and an outer relatively "hard" magnetized shell portion with relatively low and high coercivities respectively. Such a bistable ferromagnetic wire is disclosed in the Wiegand U.S. Pat. No. 3,820,090, granted June 25, 1974 and entitled "Bistable Magnetic Device". The magnetized shell portion is operable for magnetizing the core portion in a first direction, the magnetization of the core portion is reversible by application of a separate magnetic field and the shell portion is operable to remagnetize the core portion in a first direction upon removal of the separate magnetic field. As a result of the changing magnetic field, there is a net change in the flux outside of the wire and an appropriately placed pick-up coil will generate a pulse-shaped voltage having a peak value and a narrow width with no relation to the changing rate of the magnetic field. Thus, the Wiegand wire is useful as a magnetic sensor. However, a conventional Wiegand wire is capable of only being able to detect a fairly high external magnetic field.

German Offenlegungsschrift No. 28 06 249 discloses a transmitter for emitting an electrical signal during the magnetic reversal of a ferromagnetic wire within a coil wherein the wire is kept under tensile stress and/or torsional stress.

SUMMARY OF THE INVENTION

The present invention provides a new and improved magnetic field sensing or Wiegand effect device which is operable by a low magnetic field and is thus capable of detecting low magnetic fields. This is accomplished by twisting a ribbon-shaped strip of amorphous magnetic material and supporting the strip in twisted condition. Such a twisted strip of amorphous magnetic material is capable of generating pulses similar to a Wiegand wire in response to a low magnetic field.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 2b is an enlarged perspective view showing the details of the embodiment illustrated in FIG. 2a.

DETAILED DESCRIPTION OF THE INVENTION

Figure 1A:
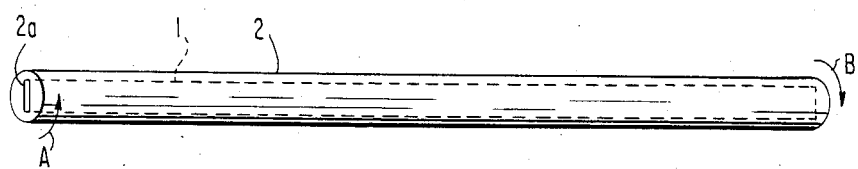
FIG. 1 is a perspective view of a ribbon-shaped strip of amorphous magnetic material and its associated casing prior to twisting.
FIG. 1b is a perspective view of the device in FIG. 1 subsequent to being twisted a number of times.
Figure 1B:
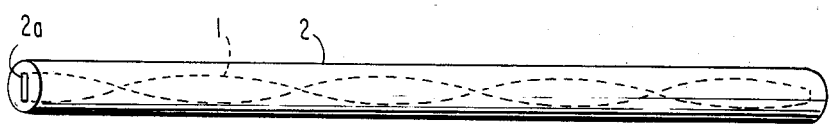

In FIG. 1 a strip of amorphous magnetic material 1 which is an alloy of $Fe_{79}Cr_2B_{17}Si_2$ by atomic weight (%) is about 1.0 cm in width, 40 $\mu$m in thickness and 10 cm in length. A casing 2 made of thermoplastic material serves as a supporting means for the strip 1 of magnetic material and is provided with a slit 2a extending the length thereof into which the amorphous magnetic material strip is inserted. Upon softening of the casing 2 by heating, the casing and the amorphous magnetic material strip 1 are easily twisted by applying twisting forces to both ends of the casing 2 in opposite directions as indicated by the arrows A and B in FIG. 1a. After the strip 1 is twisted a predetermined number of times, the casing 2 is cooled and hardened so that the strip of amorphous magnetic material 1 is supported in a twisted condition as shown in FIG. 1b.

Figure 2A:
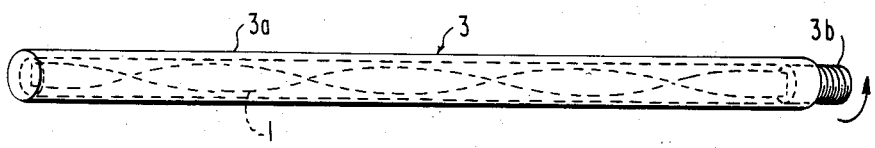
FIG. 2a is a perspective view of another embodiment of a twisted ribbon-shaped amorphous magnetic strip and associated casing.
Figure 2B:
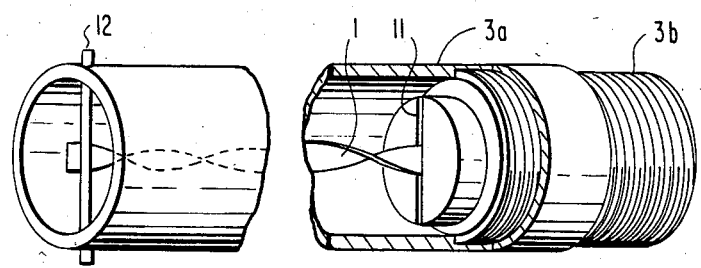

In the embodiment of FIG. 2a, a hollow casing 3 is provided in the form of a cylinder 3a having a threaded plug 3b screwed into one end of the cylinder 3a. The lefthand end of the strip 1 as viewed in FIG. 2a is secured to the respective end of the cylinder 3a by any suitable means and the righthand end of the strip is secured by any suitable means to the end of the plug 3b. For example, as seen in FIG. 2b, a slit 11 could be formed in the plug 3b for receiving the end of the strip 1 while the other end of the strip 1 could be secured by welding or the like to a rod 12 extending through the end portion of the cylinder 3a. Thus, upon rotation of the threaded plug 3b, the strip 1 of amorphous magnetic material can be twisted a predetermined number of times and supported in a twisted condition. The casing 3 is made of non-magnetic, electrically insulating material.

Figure 3:
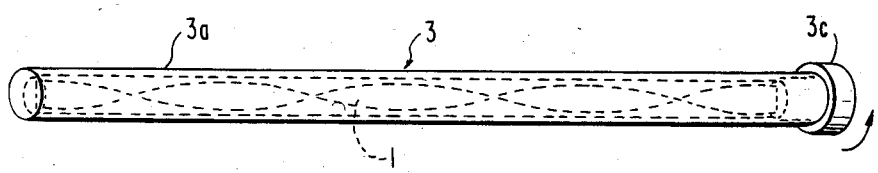
FIG. 3 is a perspective view of still another embodiment of the present invention.

The embodiment shown in FIG. 3 is similar to the embodiment shown in FIG. 2a but utilizes a smooth cap 3c instead of the threaded plug 3b. The ends of the strip 1 may be secured to the cylinder 3a and the cap 3c in a manner similar to that disclosed in the embodiment of FIGS. 2a and 2b. After turning the cap 3c a predetermined number of times, the cap may be secured to the casing 3a by means of an adhesive so that the strip of amorphous magnetic material will be supported in the twisted condition.

Figure 4:
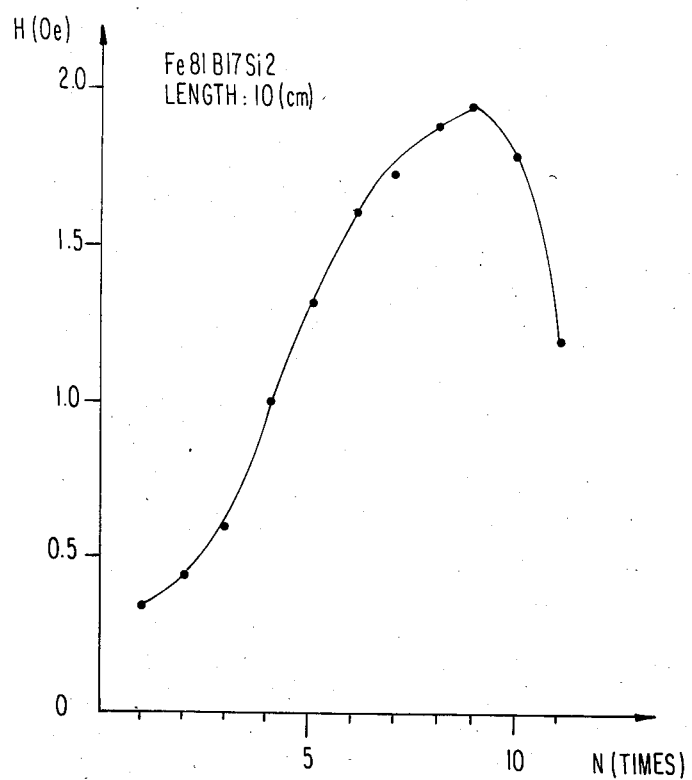
FIG. 4 is a graph showing magnetic field intensity plotted against the number of twists.

The foregoing devices are capable of sensing low magnetic fields. FIG. 4 is a graph showing the results of measuring the detectable magnetic field intensity H[Oe] with the device according to the present invention against the number of twists in the strip 1 of amorphous magnetic material. Thus, it is seen that the level of the minimum detectable magnetic field is very low in comparison with the minimum detectable magnetic field for conventional Wiegand effect wires which is on the order of 3.0 [Oe]. The amorphous magnetic material used in the measurement of the values for the graph of FIG. 4 is alloyed of $Fe_{81}B_{17}Si_2$ by atomic weight (%).

Figure 5:
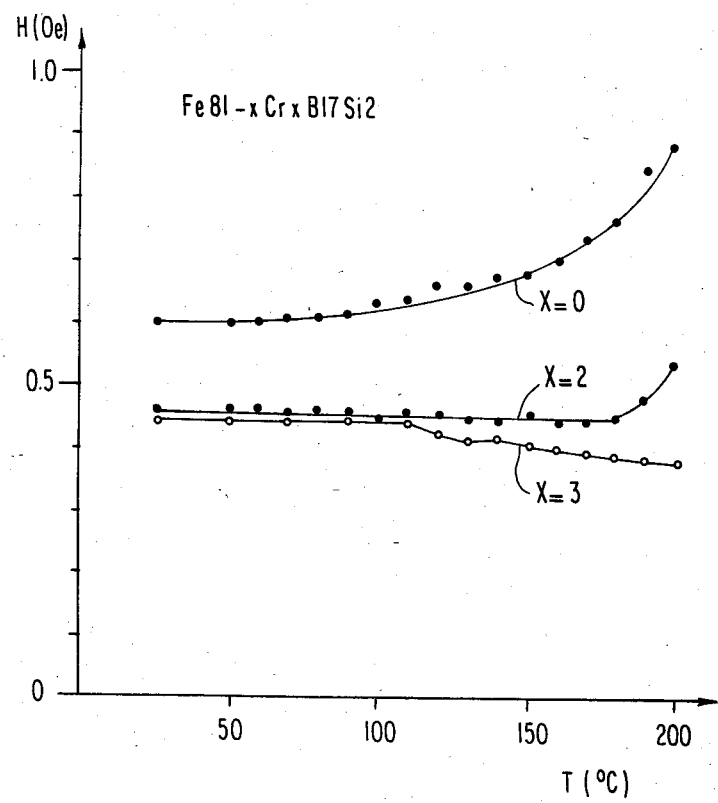
FIG. 5 is a graph showing magnetic field intensity plotted against the temperature of the atmosphere.

FIG. 5 is a graph which illustrates the results of measuring the minimum detectable magnetic field intensity H[Oe] with respect to the temperature of the atmosphere T[°C.] for an amorphous magnetic material alloyed of $Fe_{81}B_{17}Si_2$, $Fe_{79}Cr_2B_{17}Si_2$ and $Fe_{78}Cr_3B_{17}Si_2$ by atomic weight (%). This property is measured 10 minutes after each change in temperature. The strip of amorphous magnetic material is 10 cm in length and is provided with 10 twists. Upon examination of the graph in FIG. 5, it can be seen that the level of the detectable magnetic field intensity is stable over a wide range of temperatures especially for $Fe_{79}Cr_2B_{17}Si_2$.

Also, as a result of the measurements, the magnetic field sensing device according to the present invention has a sharp detectability so that the output voltage of the magnetic sensor using the magnetic field sensing device according to the present invention is 20 to 50 $\mu s$ in pulse width at the applied magnetic field above 1.2 Oe oscillating in the frequency range of 0.01 Hz to 6 kHz.

The magnetic sensor using the magnetic field sensing device according to the present invention may be in the form of the transmitter disclosed in German Offenlegungsschrift No. 28 06 249 wherein a coil surrounds the magnetic field sensing device.

In summary, the magnetic field sensing device according to the present invention provides a highly efficient device for sensing low magnetic field levels over a wide range of temperatures. The magnetic field sensing device according to the present invention is provided by simply twisting a strip of amorphous magnetic material which thereby eliminates the need for complicated, time consuming processing.

While the invention has been particularly shown and described with reference to preferred embodiments thereof, it will be understood by those in the art that the foregoing and other changes in form and details may be made therein without departing from the spirit and scope of the invention.

What is claimed is:

1. A magnetic field sensing device comprising a ribbon of amorphous magnetic material having at least one twist therein along the axis of the ribbon between the ends thereof and means for supporting said strip in twisted condition.

2. A magnetic field sensing device as set forth in claim 1, wherein said means for supporting said strip in twisted condition is comprised of a cylinder of elastic material having securing means at opposite ends of said cylinder for engaging and supporting the ends of said strip disposed within said cylinder.

3. A magnetic field sensing device as set forth in claim 2, wherein said supporting means at one end of said cylinder is comprised of an externally threaded plug to which one end of said strip is secured and internal threads in the adjacent end of said cylinder into which said plug may be rotated to twist said strip.

4. A magnetic field sensing device as set forth in claim 2, wherein said supporting means is comprised of a cap to which one end of said strip is secured and securing means for securing said cap to said cylinder after said strip has been twisted the desired number of times.

5. A magnetic field sensing device as set forth in claim 1, wherein said means for supporting said strip is comprised of a cylinder of plastic material having a twisted slot extending the length thereof for supporting said strip in twisted condition.

* * * * *